(12) United States Patent
Wise et al.

(10) Patent No.: US 8,828,835 B2
(45) Date of Patent: Sep. 9, 2014

(54) ULTRASHALLOW EMITTER FORMATION USING ALD AND HIGH TEMPERATURE SHORT TIME ANNEALING

(75) Inventors: Rick L. Wise, Fairview, TX (US); Hiroshi Yasuda, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 870 days.

(21) Appl. No.: 12/718,142

(22) Filed: Mar. 5, 2010

(65) Prior Publication Data

US 2011/0057289 A1  Mar. 10, 2011

Related U.S. Application Data

(60) Provisional application No. 61/157,969, filed on Mar. 6, 2009.

(51) Int. Cl.
*H01L 21/331* (2006.01)
*H01L 21/02* (2006.01)
*H01L 29/732* (2006.01)
*H01L 21/225* (2006.01)
*H01L 29/66* (2006.01)

(52) U.S. Cl.
CPC ...... *H01L 29/7325* (2013.01); *H01L 21/02063* (2013.01); *H01L 21/2254* (2013.01); *H01L 29/66242* (2013.01); *H01L 29/66272* (2013.01)
USPC ..................... 438/369; 438/350; 257/E21.372

(58) Field of Classification Search
USPC ......... 438/309, 378, 235, 312, 316, 343, 350, 438/365, 368, 369; 257/E21.372
See application file for complete search history.

(56) References Cited

U.S. PATENT DOCUMENTS

| | | | |
|---|---|---|---|
| 6,541,353 B1 * | 4/2003 | Sandhu et al. | 438/478 |
| 2007/0004161 A1 * | 1/2007 | Chantre et al. | 438/309 |
| 2009/0120924 A1 * | 5/2009 | Moffatt et al. | 219/385 |
| 2009/0203197 A1 * | 8/2009 | Hanawa et al. | 438/513 |

* cited by examiner

*Primary Examiner* — Laura Menz
*Assistant Examiner* — Candice Y Chan
(74) *Attorney, Agent, or Firm* — Jacqueline J. Garner; Frederick J. Telecky, Jr.

(57) ABSTRACT

An integrated circuit containing a bipolar transistor including an emitter diffused region with a peak doping density higher than $1 \cdot 10^{20}$ atoms/cm$^3$, and an emitter-base junction less than 40 nanometers deep in a base layer. A process of forming the bipolar transistor, which includes forming an emitter dopant atom layer between a base layer and an emitter layer, followed by a flash or laser anneal step to diffuse dopant atoms from the emitter dopant atom layer into the base layer.

10 Claims, 3 Drawing Sheets

ULTRASHALLOW EMITTER FORMATION USING ALD AND HIGH TEMPERATURE SHORT TIME ANNEALING

FIELD OF THE INVENTION

This invention relates to the field of integrated circuits. More particularly, this invention relates to bipolar transistors in integrated circuits.

BACKGROUND OF THE INVENTION

It may be desirable to reduce the emitter-base junction depth in a polysilicon emitter bipolar transistor in an integrated circuit. Reducing dopant diffusion from the polysilicon emitter may undesirably lead to encroachment of the emitter-base junction depletion region on the polysilicon in the emitter.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

The instant invention provides an integrated circuit containing a bipolar transistor with an emitter diffused region doped higher than $1 \cdot 10^{20}$ atoms/cm$^3$, and an emitter-base junction less than 40 nanometers deep in a base layer, and a process of forming the bipolar transistor.

DETAILED DESCRIPTION

Figure 1A:
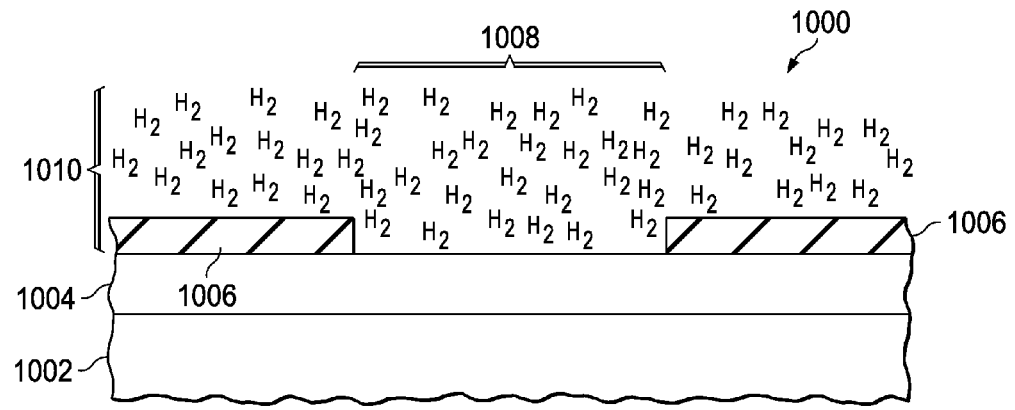
FIG. 1A through FIG. 1D are cross-sections of an integrated circuit containing a bipolar transistor formed according to an embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides an integrated circuit containing a bipolar transistor with an emitter diffused region doped higher than $1 \cdot 10^{20}$ atoms/cm$^3$, and an emitter-base junction less than 40 nanometers deep in a base layer, and a process of forming the bipolar transistor.

FIG. 1A through FIG. 1D are cross-sections of an integrated circuit containing a bipolar transistor formed according to an embodiment of the instant invention, depicted in successive stages of fabrication. Referring to FIG. 1A, the integrated circuit 1000 includes a collector region 1002 of the bipolar transistor. In some embodiments, the collector region 1002 may be silicon. A base layer 1004 is formed on a top surface of the collector region 1002. In one embodiment, the base layer 1004 may be epitaxially grown silicon. In an alternate embodiment, the base layer 1004 may be silicon-germanium. In a further embodiment, the base layer 1004 may be silicon-germanium-carbon. In yet another embodiment, the base layer 1004 may include another semiconductor material. An isolation layer 1006 is formed on a top surface of the base layer 1004. The isolation layer 1006 may be one or more layers of silicon dioxide, silicon nitride, silicon oxy-nitride, or other dielectric material. In some embodiments, the isolation layer 1006 may be 50 to 100 nanometers thick. An emitter opening 1008 is defined in the isolation layer 1006 to expose the top surface of the base layer 1004. In one embodiment, after forming the emitter opening 1008, the top surface of the base layer 1004 may be exposed to an aqueous solution of hydrofluoric acid, followed by a rinse process and a drying process.

In one embodiment, the integrated circuit 1000 is exposed to a hydrogen containing ambient 1010 at 750 to 950° C. for 30 to 120 seconds to remove impurities from the top surface of the base layer 1004 in the emitter opening 1008. The hydrogen containing ambient 1010 may have a total pressure between 10 torr and atmospheric pressure. Other methods of removing impurities from the top surface of the base layer 1004 in the emitter opening 1008 are within the scope of the instant invention. In one embodiment, the integrated circuit is not exposed to an atmospheric ambient between the process of removing impurities described in reference to FIG. 1A and a subsequent process step.

Figure 1B:
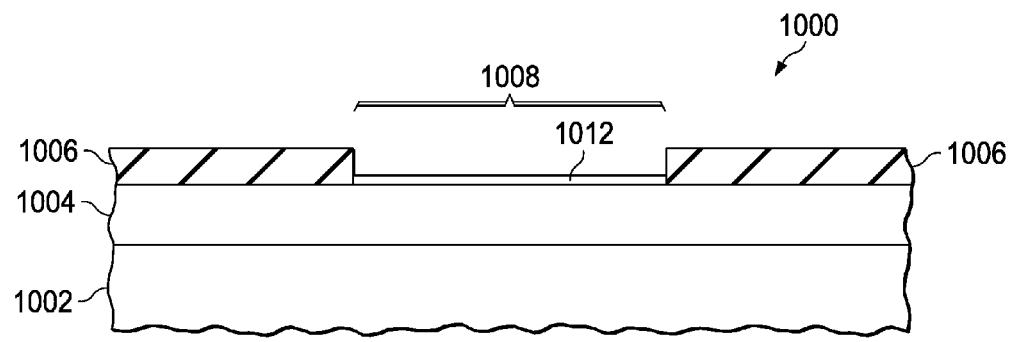

Referring to FIG. 1B, a layer of emitter dopant atoms 1012 is formed on the top surface of the base layer 1004 in the emitter opening 1008. Dopant atoms in the emitter dopant atom layer 1012 are a species to provide a conductivity type that is opposite a conductivity type of the base layer 1004. For example, in an embodiment in which the base layer 1004 is n-type silicon, the dopant atoms in the emitter dopant atom layer 1012 provide a p-type conductivity, such as boron. In another example, in an embodiment which the base layer 1004 is p-type silicon, the dopant atoms in the emitter dopant atom layer 1012 provide an n-type conductivity, such as phosphorus or arsenic. In one embodiment, the emitter dopant atom layer 1012 may be between 0.5 and 5 monolayers of dopant atoms.

In one embodiment, the emitter dopant atom layer 1012 may be formed using an atomic layer deposition (ALD) process. In an ALD process, the integrated circuit 1000 is heated to between 300 and 600° C. An existing top surface of the integrated circuit 1000 is exposed to an ambient containing gaseous precursors of the dopant atoms in the emitter dopant atom layer 1012. For example, in embodiments in which the emitter dopant atom layer 1012 includes boron, the ALD ambient may include diborane ($B_2H_6$). In another example, in embodiments in which the emitter dopant atom layer 1012 includes phosphorus, the ALD ambient may include phosphine ($PH_3$). In a further example, in embodiments in which the emitter dopant atom layer 1012 includes arsenic, the ALD ambient may include arsine ($AsH_3$). The precursor containing ALD ambient may have a total pressure between 10 and 150 torr.

It is within the scope of the instant invention to form the emitter dopant atom layer 1012 using another process than ALD. For example, the emitter dopant atom layer 1012 may be formed by a physical vapor deposition (PVD) process.

Figure 1C:
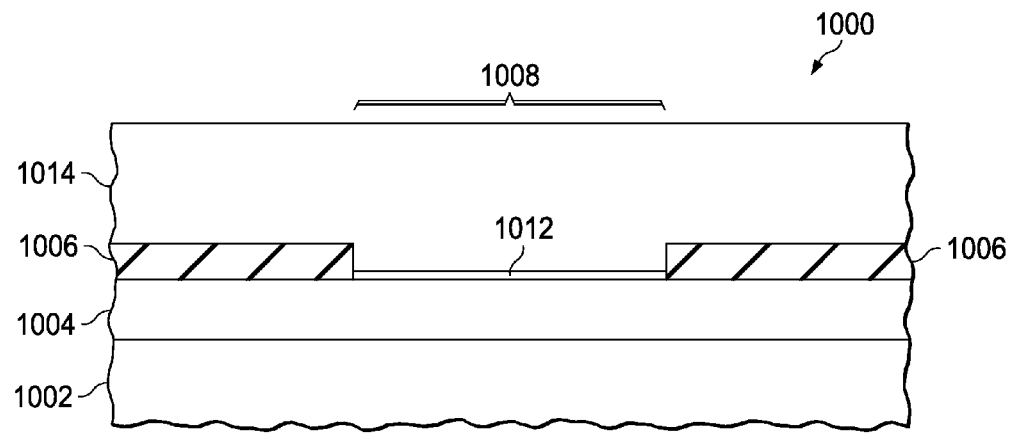

Referring to FIG. 1C, an emitter layer 1014 is formed on a top surface of the emitter dopant atom layer 1012 and a top surface of the isolation layer 1006. In one embodiment, the emitter layer 1014 may be polycrystalline silicon, commonly known as polysilicon. The emitter layer 1014 may be between 100 and 300 nanometers thick. In one embodiment, the emitter layer 1014 has a conductivity type opposite that of the base layer 1004. In a further embodiment, an average doping density in the emitter layer 1014 may be between $1 \cdot 10^{20}$ and $1 \cdot 10^{22}$ atoms/cm$^3$.

Figure 1D:
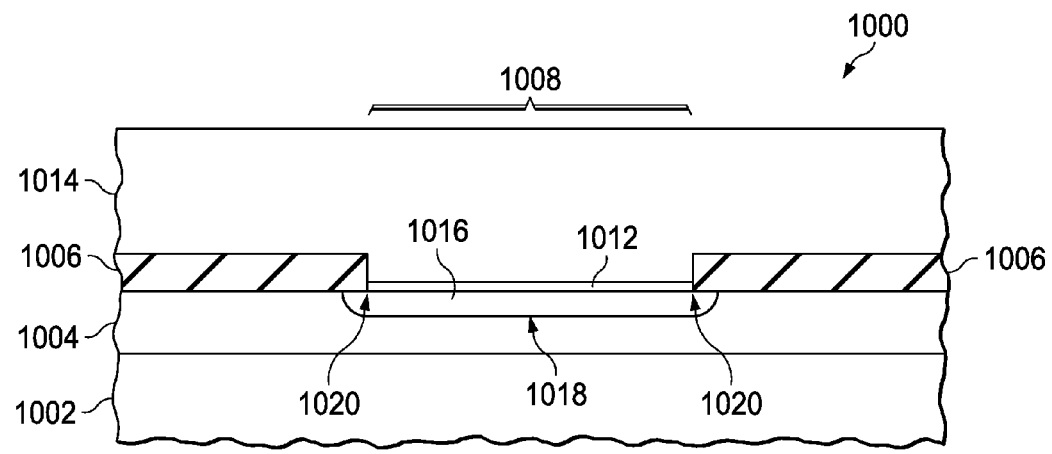

Referring to FIG. 1D, an anneal process is performed which causes the dopant atoms in the emitter dopant atom layer 1012 to diffuse into the base layer 1004 to form an emitter diffused region 1016 in the base layer 1004, and electrically activates a portion of the dopant atoms. In one embodiment, more than 90 percent of the dopant atoms in the emitter dopant atom layer 1012 may diffuse into the base layer 1004, so that less than 10 percent of the emitter dopant atom layer 1012 remains on the top surface of the base layer 1004 after the anneal step is completed. In an alternate embodiment, more than 90 percent of the dopant atoms in the emitter diffused region 1016 may remain on the top surface of the base later 1004 after the anneal step is completed. The emitter diffused region 1016 extends from the top surface of the base layer 1004 in the emitter opening 1008 to a depth between 10 and 40 nanometers. In one embodiment, the depth is less than 20 nanometers. The emitter diffused region 1016 has an opposite conductivity type as the base layer 1004. In one embodiment, a peak doping density in the emitter diffused region 1016 is above $1 \cdot 10^{20}$ atoms/cm$^3$. In a further embodiment, the peak doping density in the emitter diffused region 1016 is above $1 \cdot 10^{21}$ atoms/cm$^3$.

Forming the emitter diffused region 1016 to have a doping density above $1 \cdot 10^{21}$ atoms/cm$^3$ may advantageously reduce a capacitance density of an emitter-base junction 1018, compared to emitter diffused regions with lower doping densities. Forming the emitter diffused region 1016 to have a doping density above $1 \cdot 10^{21}$ atoms/cm$^3$ may also advantageously reduce a depletion region near the emitter layer 1014 at corners 1020 of the emitter opening 1008 as compared to emitter diffused regions with lower doping densities. Forming the emitter diffused region 1016 to have a depth in the base layer 1004 less than 20 nanometers may advantageously reduce a series resistance of the bipolar transistor, compared to emitter diffused regions with greater depths.

Figure 2A:
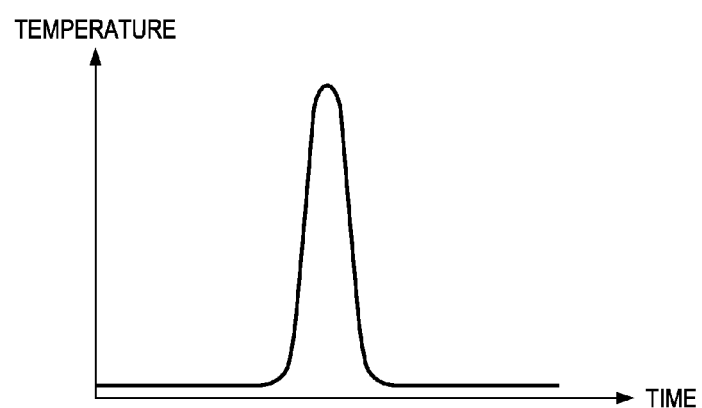
FIG. 2A through FIG. 2C are charts of thermal profiles of embodiments of anneal processes.

In one embodiment, the anneal step may be performed using a flash anneal process. A flash anneal process heats the entire top surface of the integrated circuit 1000 simultaneously, to a temperature between 1050 and 1350° C. for a time period between 1 millisecond and 100 milliseconds. A temperature profile of a flash anneal process is depicted in FIG. 2A. In one embodiment, a single thermal pulse in a flash anneal tool may be sufficient to cause the dopant atoms from the emitter dopant atom layer 1012 to diffuse to a desired depth and activate a desired portion of the dopant atoms. In a further embodiment, more than one thermal pulse in a flash anneal tool may be applied to the integrated circuit 1000 to cause the dopant atoms from the emitter dopant atom layer 1012 to diffuse to a desired depth and activate a desired portion of the dopant atoms.

Figure 2B:
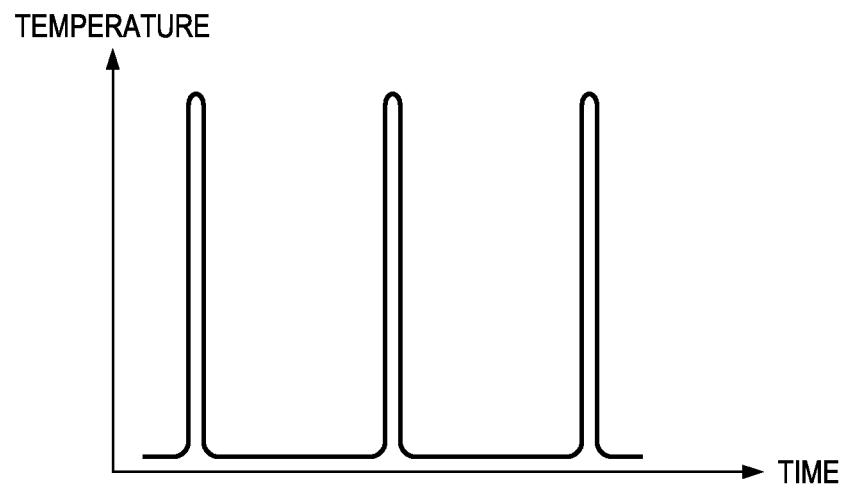

In another embodiment, the anneal step may be performed using a laser anneal process. A laser anneal process sequentially heats portions of the top surface of the integrated surface 1000 to a temperature greater than 1250° C. for a period of time less than 500 microseconds. In a further embodiment, the bipolar transistor may be annealed using repeated thermal pulses from a laser anneal tool. A thermal profile of repeated thermal pulses from a laser anneal tool is depicted in FIG. 2B.

Figure 2C:
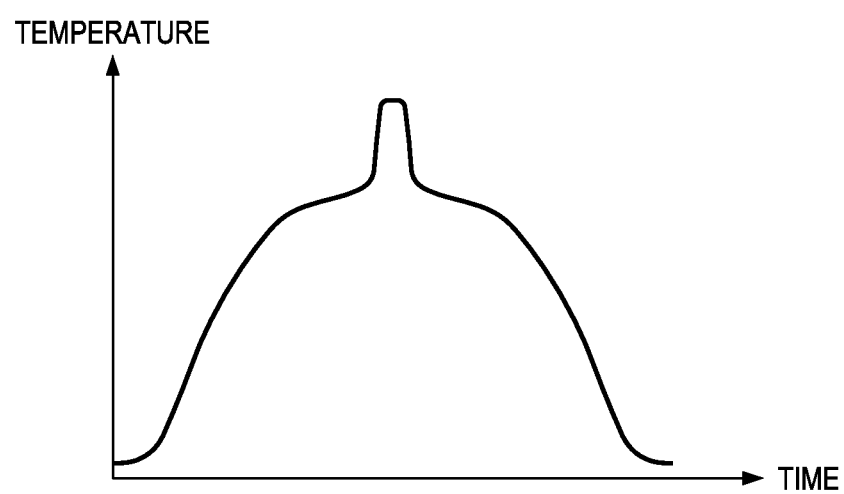

In a further embodiment, the anneal step may be performed in a flash anneal tool which is programmed to heat the integrated circuit to a temperature between 850 and 1050° C. for a time period between 1 and 5 seconds, subsequently heat the wafer to a temperature between 1050 and 1350° C. for a time period between 1 millisecond and 100 milliseconds, and then heat the integrated circuit to a temperature between 850 and 1050° C. for a time period between 1 and 5 seconds. Such a thermal profile is depicted in FIG. 2C.

What is claimed is:

1. A process of forming an integrated circuit, comprising the steps:

forming a bipolar transistor, by a process further including the steps:

providing a base layer, said base layer having a first conductivity type;

forming an isolation layer on a top surface of said base layer;

removing isolation material from said isolation layer in an area of an emitter opening, so that no isolation layer material is located above said base layer in said emitter opening area;

removing impurities from said top surface of said base layer in said emitter opening area;

forming an emitter dopant atom layer on said top surface of said base layer in said emitter opening area, said emitter dopant atom layer having between 0.5 and 5 monolayers of dopant atoms;

forming an emitter layer comprising polysilicon on a top surface of said emitter dopant atom layer in said emitter opening area prior to annealing the emitter dopant atom layer; and performing an anneal process on said integrated circuit, such that dopant atoms in said emitter dopant atom layer diffuse into said base layer so as to form an emitter diffused region, said emitter diffused region extending from said top surface of said base layer in said emitter opening area to a depth between 10 and 40 nanometers, said emitter diffused region having a second conductivity type opposite from said first conductivity type and a peak doping density greater than $1 \cdot 10^{20}$ atoms/cm$^3$.

2. The process of claim 1, in which said step of forming said emitter dopant atom layer is performed using an ALD process, said ALD process further including the steps of:

heating said integrated circuit to a temperature between 300 and 600° C.; and exposing said top surface of said base layer in said emitter opening area to an ambient containing gaseous precursors of said dopant atoms in said emitter dopant atom layer, said ambient having a pressure between 10 torr and atmospheric pressure.

3. The process of claim 1, in which said step of performing said anneal process is performed in a flash anneal tool, so that said integrated circuit is heated to a temperature between 1050 and 1350° C. for a time period between 1 millisecond and 100 milliseconds.

4. The process of claim 1, in which said step of performing said anneal process is performed in a laser anneal tool, so that portions of a top surface of said integrated circuit are sequentially heated by a plurality of thermal pulses, each said thermal pulse heating said portion of said top surface of said integrated circuit temperature greater than 1250° C. for a period of time less than 500 microseconds.

5. The process of claim 1, in which said step of performing said anneal process is performed in a flash anneal tool, said anneal process further including the steps:
heating the integrated circuit to a temperature between 850 and 1050° C. for a time period between 1 and 5 seconds;
subsequently heating the integrated circuit to a temperature between 1050 and 1350° C. for a time period between 1 millisecond and 100 milliseconds; and
subsequently heating the integrated circuit to a temperature between 850 and 1050° C. for a time period between 1 and 5 seconds.

6. The process of claim 1, in which said peak doping density of said emitter diffused region is greater than $1 \cdot 10^{21}$ atoms/cm$^3$.

7. The process of claim 1, in which said dopant atoms of said emitter dopant atom layer consist essentially of boron atoms.

8. The process of claim 1, in which said dopant atoms of said emitter dopant atom layer consist essentially of phosphorus atoms.

9. A process of forming an integrated circuit, comprising the steps:
forming a bipolar transistor, by a process further including the steps:
providing a base layer, said base layer having a first conductivity type;
forming an isolation layer on a top surface of said base layer;
removing isolation material from said isolation layer in an area of an emitter opening, so that no isolation layer material is located above said base layer in said emitter opening area;
removing impurities from said top surface of said base layer in said emitter opening area;
forming an emitter dopant atom layer on said top surface of said base layer in said emitter opening area, said emitter dopant atom layer having between 0.5 and 5 monolayers of dopant atoms, wherein the integrated circuit is not exposed to an atmospheric ambient between the step of removing impurities and forming the emitter dopant atom layer;
forming an emitter layer comprising polysilicon on a top surface of said emitter dopant atom layer in said emitter opening area; and
after forming the emitter layer, performing a flash anneal process on said integrated circuit, such that dopant atoms in said emitter dopant atom layer diffuse into said base layer so as to form an emitter diffused region, said emitter diffused region having a second conductivity type opposite from said first conductivity type.

10. A process of forming an integrated circuit, comprising the steps:
forming a bipolar transistor, by a process further including the steps:
providing a base layer, said base layer having a first conductivity type;
forming an isolation layer on a top surface of said base layer;
removing isolation material from said isolation layer in an area of an emitter opening, so that no isolation layer material is located above said base layer in said emitter opening area;
removing impurities from said top surface of said base layer in said emitter opening area;
forming an emitter dopant atom layer on said top surface of said base layer in said emitter opening area, said emitter dopant atom layer having between 0.5 and 5 monolayers of dopant atoms, wherein the integrated circuit is not exposed to an atmospheric ambient between the step of removing impurities and forming the emitter dopant atom layer;
forming an emitter layer comprising polysilicon on a top surface of said emitter dopant atom layer in said emitter opening area; and
after forming the emitter layer, performing a laser anneal process on said integrated circuit, such that dopant atoms in said emitter dopant atom layer diffuse into said base layer so as to form an emitter diffused region, said emitter diffused region having a second conductivity type opposite from said first conductivity type.

* * * * *